United States Patent [19]

Dalal et al.

[11] Patent Number: 4,465,706

[45] Date of Patent: Aug. 14, 1984

[54] BANDGAP CONTROL IN AMORPHOUS SEMICONDUCTORS

[75] Inventors: Vikram L. Dalal; M. Akhtar, both of Lawrenceville, N.J.

[73] Assignee: Chronar Corporation, Princeton, N.J.

[21] Appl. No.: 323,585

[22] Filed: Nov. 20, 1981

[51] Int. Cl.³ .......................................... H01L 21/205
[52] U.S. Cl. ...................................... 427/86; 427/87; 427/95
[58] Field of Search .............................. 427/86, 95, 87

[56] References Cited

U.S. PATENT DOCUMENTS 4,237,150 12/1980 Wiesmann ............................ 427/95
4,237,151 12/1980 Strongin ............................... 427/95
4,339,470 7/1982 Carlson ................................ 427/86
4,357,179 11/1982 Adams ................................. 427/86

OTHER PUBLICATIONS

Scott et al., "Deposition of a-Si:H by Homogeneous CVD", Journal De Physique, Colloque C4, Supplément au No. 10, Tome 42, Oct. 1981.

Primary Examiner—John D. Smith
Attorney, Agent, or Firm—George E. Kersey

[57] ABSTRACT

Method of producing amorphous semiconductor hydrides (hydrogenated amorphous semiconductors) with specified bandgaps. The desired bandgap is achieved by controlling the temperature and partial pressure of higher order semiconductanes which are created pyrolytically, for example, on a substrate.

10 Claims, 4 Drawing Figures

BANDGAP CONTROL IN AMORPHOUS SEMICONDUCTORS

BACKGROUND OF THE INVENTION

This invention relates to the production of amorphous semiconductors having a specified bandgap, and, more particularly, to amorphous silicon having such a bandgap.

Semiconductors have an extended region of discontinuity in their internal energy levels between their valence and conduction bands. This region of discontinuity is known as a "bandgap". It determines how a device made from the material will respond to external stimuli.

In order to realize the most efficient interchange or interaction between a device and its source of activation, for example, between the solar spectrum and a photo responsive device, it is advantageous to match the bandgap of the device to that of the energizing spectrum. This procedure is analogous to the matching of electrical elements in order to obtain maximum energy transfer.

Unfortunately, previously produced semiconductors have been characterised by unpredictable bandgaps. It has not been possible in the case of silicon, for example, to provide bandgaps that could achieve the most efficient use of the devices made with the semiconductors.

Accordingly, it is an object of the invention to achieve precision control over the bandgaps of semiconductors. A related object is to achieve precision control over the bandgaps of amorphous silicon.

SUMMARY OF THE INVENTION

In accomplishing the foregoing and related objects, the invention provides a method of preparing an amorphous semiconductor with a specified bandgap by the pyrolytic decomposition of one or more gaseous phase polysemiconductanes at a specified temperature for each desired bandgap.

In accordance with one aspect of the invention, bandgap may also be controlled by employing a specified pressure. In addition, various combinations of temperature and pressure may be used to achieve the desired bandgap.

In accordance with another aspect of the invention, the prescribed temperature is in the range from about 300° C. to about 500° C., preferably in the range from about 350° C. to about 450° C., and is limited to a variation during pyrolytic decomposition of no more than ten percent. In an illustrative case, the temperature has a mid value of 400° C. and is allowed to vary during decomposition no lower than 380° C. and no higher than 420° C. This control produces a bandgap in undoped amorphous silicon of about 1.6 electron volts.

In accordance with a further aspect of the invention, a desired bandgap characteristic can be provided by modulating temperature about a prescribed level. The modulation may take any convenient form, depending upon a characteristic desired. For example, the modulation may be sinusoidal, triangular, or in the form of some other geometric function. The modulation may be linear or non-linear.

DESCRIPTION OF THE DRAWINGS

Other aspects of the invention will become apparent after considering several illustrative embodiments taken in conjunction with the drawings, in which.

DETAILED DESCRIPTION

Figure 1:
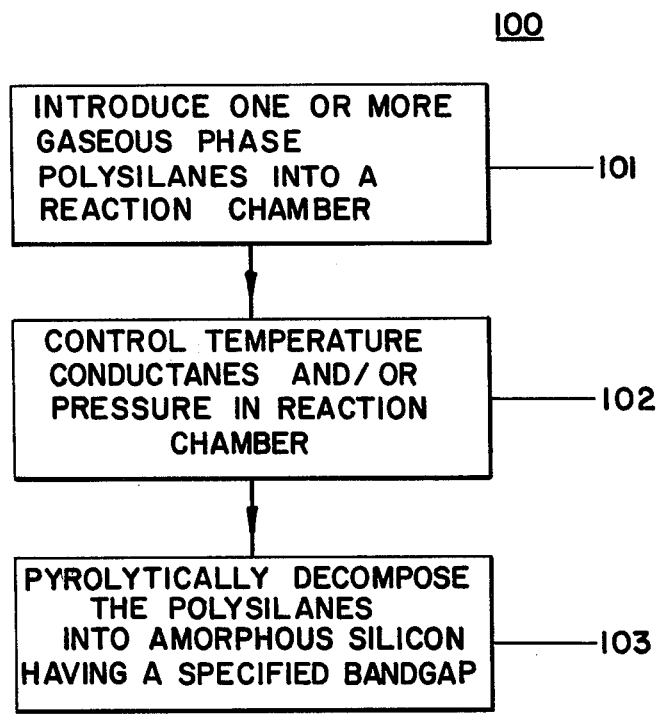
FIG. 1 is a flow chart of a method in accordance with the invention for preparing amorphous silicon with a specified bandgap.

With reference to the drawings, a flow chart 100 for the general practice of the invention is set forth in FIG. 1. The process begins with the introduction of a gaseous phase mixture containing at least one higher order silane into a reaction chamber, as illustrated by block 101. In the reaction chamber the gaseous phase mixture has its desired temperature and/or pressure controlled in accordance with block 102. The result, as indicated by block 103, is the pyrolytic decomposition of the gaseous phase mixture to deposit amorphous silicon having a specified bandgap.

It will be understood that the process is equally applicable to other semiconductanes, such as Germanes, with the deposition temperature being adjusted to be suitable for the material being pyrolytically decomposed. A similar consideration also applies to the presure that is employed.

Figure 2:
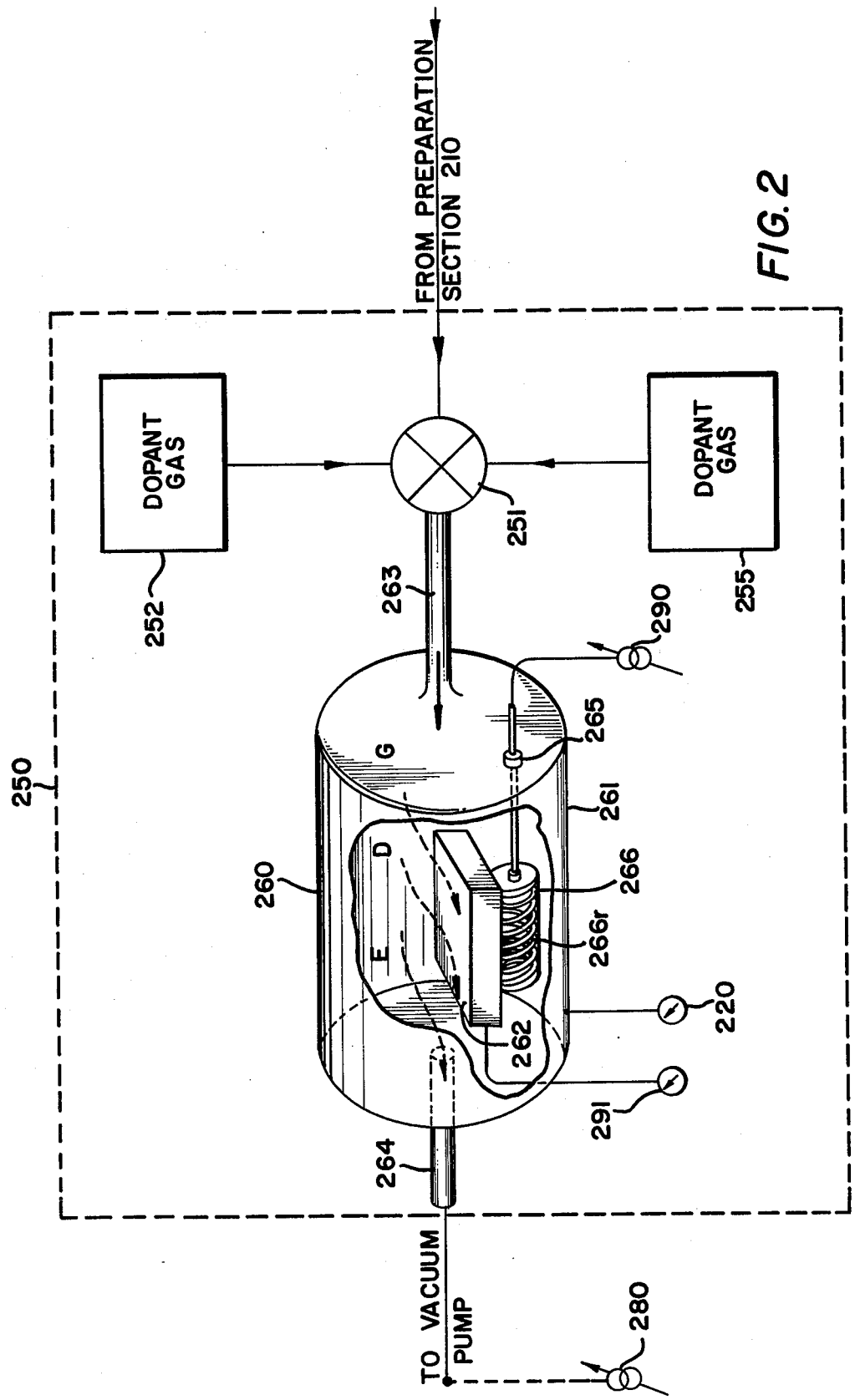
FIG. 2 is a schematic diagram of an illustrative reaction chamber for preparing amorphous silicon in accordance with the invention.

An illustrative arrangement 250 for producing semiconductors with controlled bandgaps is illustrated in FIG. 2. The semiconductanes to be converted, including higher order silanes, are prepared in a preliminary section 210 (not shown) and introduced at a mixing valve 251. The latter permits the controlled introduction either simultaneously or at desired intervals of time, of dopant gases from source 252 and/or 255. The result is a gaseous stream which is applied at an inlet 263 of a reaction chamber 260. The incoming gaseous stream, indicated by the arrow G, is drawn over a substrate 262 by the action of a vacuum pump 280. In addition the substrate 262 is subjected to controlled heating by a heater 266r in a holder 266. A current is applied to the heater 266r from an adjustable source 290. The temperature of the substrate is monitored by a guage 291 which illustratively extends to the substrate 262. A further gauge 264 for the vacuum pump 280 gives an indication of the pressure within the reaction chamber 260.

As the incoming gaseous phase mixture G is drawn over the heated substrate 262 it pyrolytically decomposes and forms an amorphous semiconductor on the upper surface of the substrate, as indicated by the dashed line arrows D. The portion of the gaseous phase mixture that does not participate in the pyrolytic decomposition is drawn from the chamber into the vacuum pump 280 as exhaust gas E.

With the pressure indicated by the pressure gauge 270 held at a fixed level by constant operation of the vacuum pump 280, and with the substrate maintained at a prescribed temperature T as indicated by the temperature guage 291, the semiconductor material that becomes pyrolytically deposited on the substrate has a prescribed bandgap. As the substrate temperature is changed and held constant, the bandgap of the deposited material changes accordingly.

The control that is achieved in accordance with the invention over the bandgap appears to result from the changes that are controllably made in the amount of hydrogen bonded to the semiconductane atoms of the deposit. While it has been known that many amorphous semiconductors, such as those produced by gaseous discharge, had hydrogen compensated defects because of ion bombardment, it had been believed that amorphous films produced by pyrolytic decomposition contained little hydrogen bonding. It was further believed that at low pressure levels where there was virtually no ion bombardment in the pyrolytic process, there was no hydrogen bonding in the resulting amorphous silicon.

Our tests of the infra-red spectrum of pyrolytic amorphous silicon have indicated the presences of slight amounts of hydrogen. We believe that this is only necessary to compensate for certain of the amorphous bonds that are created in the pyrolytic decomposition process. In other words, because of the amorphous nature of the resulting material an occasional hydrogen bond appears to be created because of the need to compensate for structural irregularities in the resultant materials. In any event our speculation as to the nature of the hydrogen bonding created in amorphous semiconductors formed by pyrolytic decomposition appears to be confirmed by the illustrative infra-red spectrum of FIG. 3, in which the percentage transmittance is plotted against wave numbers in reciprocal centimeters. The distinct absorption at 1978 wave numbers is characteristic of silicon hydride (Si:H) stretched bonding in which the bond between Si and H obtained is subject to linear oscillatory extensions.

Figure 3:
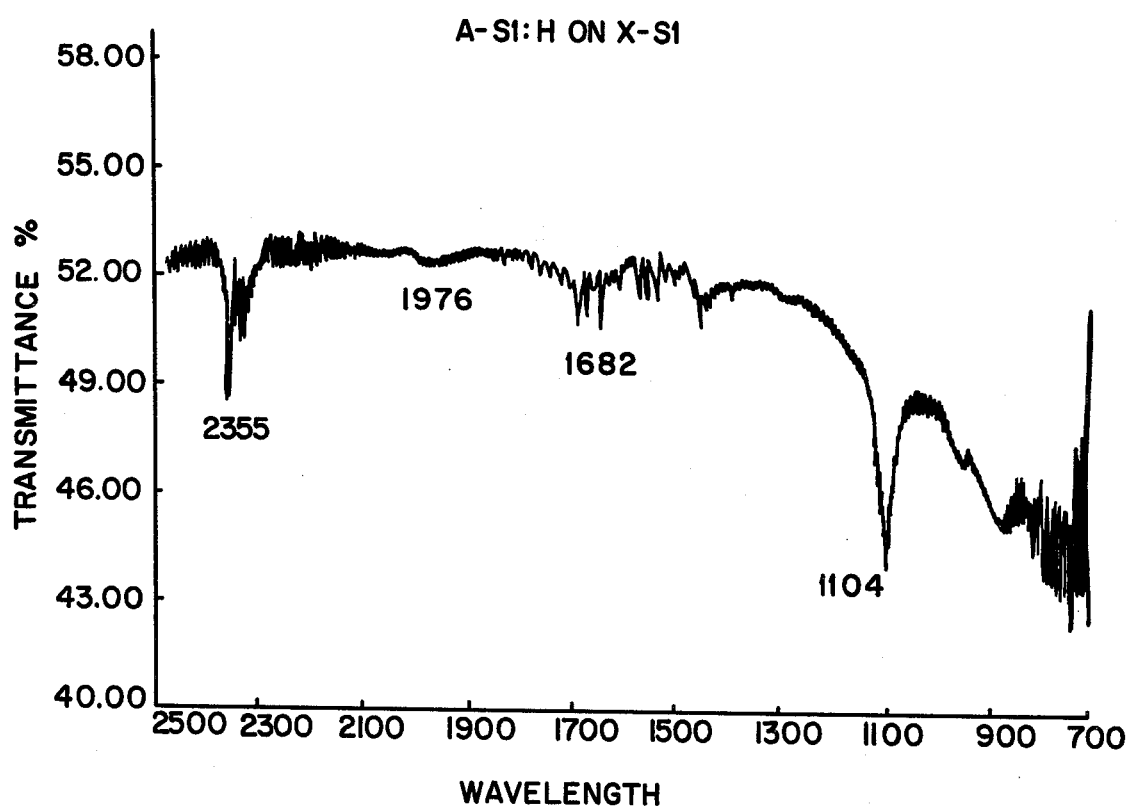
FIG. 3 is an infra-red spectrum indicating the presence of hydrogen in amorphous silicon produced with a specified bandgap.

FIG. 3 is a computer printout in which the computer was programmed to note any significant absorptions. FIG. 3 shows significant absorptions at 2355, 1682 and 1104 wave numbers, in addition to the significant silicon hydride absorption at 1978 wave numbers.

By contrast with amorphous semiconductors produced, for example, by techniques which cause a significant amount of ion bombardment and, a substantial number of defects which require compensation, the relative absence of such defects in the case of pyrolytically decomposed semiconductanes results in bandgap control by changing the amounts of hydrogen, and not defect compensation. We have found that control over temperature during pyrolytic decomposition allows the resulting material to retain its photovoltaic properties. This is significantly different than, for example, glow discharge amorphous silicon in which an increased temperature results in a reduction in the desired photoelectric effect.

One measure of the improved performance of materials with controlled bandgaps in accordance with the invention is that as temperature is increased we have been able to measure both a reduction in bandgap and an increase in short-circuit current. We have speculated that this results because an increase in temperature leads to greater coherence and ordering in the semiconductor structure, requiring a reduced amount of hydrogen for defect compensation. This is opposite to what has been observed for amorphous silicon produced in other ways, such as glow discharge, in which the excessive defect condition caused by ion bombardment appears to prevent the material from achieving greater coherence as temperature is increased.

Figure 4:
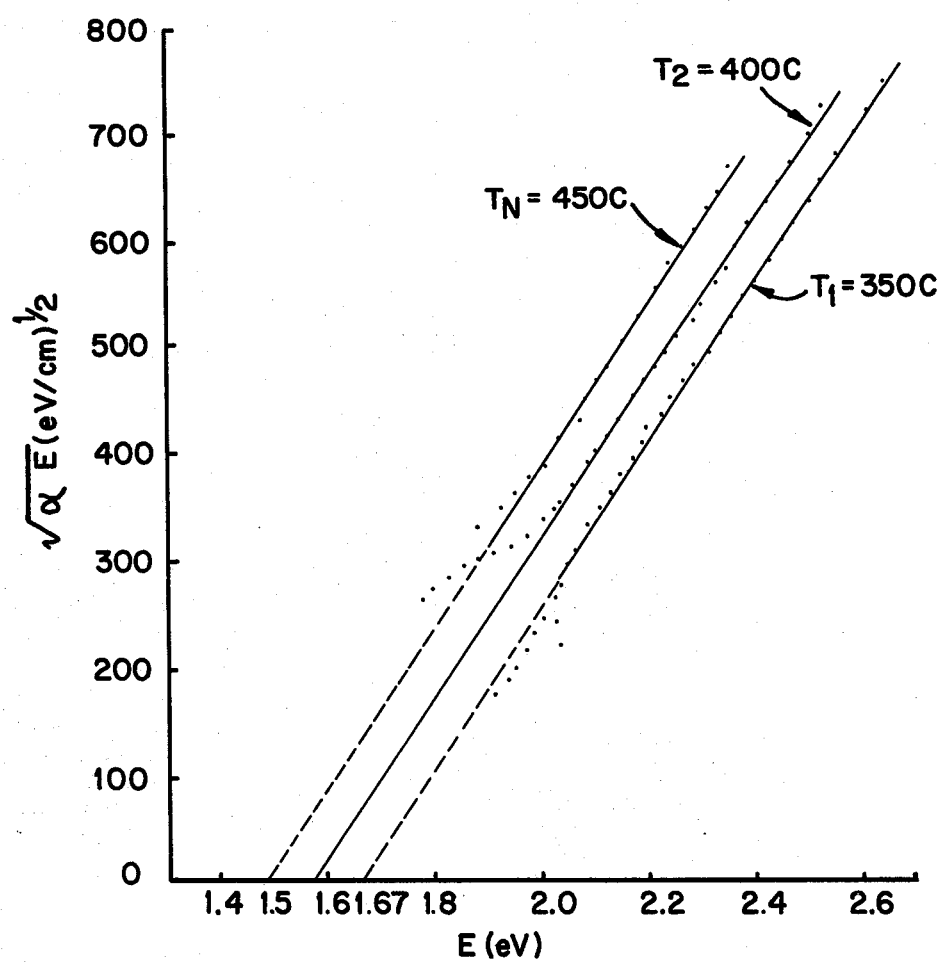
FIG. 4 is a set of parametric curves showing absorption data for amorphous silicon with controlled bandgaps in accordance with the invention.

Our observations have been supported experimentally by, for example, parametric curves of the kind shown in FIG. 4 which are plots of absorption data at different temperatures. The ordinate is the square root of the absorption coefficient alpha ($\alpha$) times energy E in electron volts. The abscissa is energy E also in electron volts.

The illustrative curves $T_l$ through $T_n$, where T represents the relatively fixed temperature at which the pyrolytic decomposition takes place, are shifted in the direction of lower energy, corresponding to the bandgap shift, as the controlled decomposition temperature is increased. The curves $T_l$ through $T_n$ all have esstentially the same slope, measured in terms of the ratio of the change in the square root of the absorption coefficient times energy $\sqrt{ae}$ to the change in energy, for the initial temperature $T_l$ through the maximum temperature $T_n$. This is significantly different than the experience for glow discharge materials in which a significant decrease in energy gap is always accompanied by a shallower slope and hence a reduced photovoltaic capability. This decrease has been previously explained by other investigators as having been due to excessive defect creation which has required a significant amount of compensatory hydrogen bonding.

If the temperatures are modulated, i.e., varied controllably, during the pyrolytic decomposition, the deposited material exhibits a variety of bandgaps with an average that is determined by the extent and duration of the modulation. In this way precision control over the composite bandgap of the resulting material can be achieved.

General procedure for producing amorphous silicon from one or more polyconductanes, including polysilanes and polygermanes, are set forth in pending application Ser. No. 242,707 filed on Mar. 11, 1981 titled Amorphous Semiconductor Method and Devices, and abandoned in favor of continuation-in-part Ser. No. 353,097 filed Mar. 5, 1982.

The invention is illustrated further with reference to the following non-limited examples:

EXAMPLE I

Polysemiconductanes selected from the class ranging from disilanes to and including hexasilanes were prepared by reacting a semiconductide such as magnesium silicide with an aqueous acid such as sulfuric, or a halogen acid such as hydrogen chloride or hydrogen fluoride. The semiconductanes of an order higher than the hexasilanes are trapped and removed from the reaction product. The higher order silanes were pyrolytically decomposed on a substrate at a temperature of 400° C. and a pressure of 40 Torrs. A film of amorphous silicon was deposited on the substrate and found to have a bandgap of 1.58–1.60 electron volts.

EXAMPLE II

Example I was repeated except that the substrate temperature was increased to 450° C. and held at substantially that temperature during the pyrolytic decomposition interval. The resulting amorphous silicon depoist was found to have a reduced bandgap of 1.48–1.50 electron volts.

EXAMPLE III

Example II was repeated except that the temperature of the pyrolytic decomposition was decreased to 350° C. for the deposit. The result was a substantial increase in bandgap as the temperature was decreased; the bandgap was found to be 1.63–1.65 electron volts.

In the case of the pyrolytic decomposition of higher order silanes the temperature can be selected in the range from about 300° C. to about 500° C. and is preferably selected in the range from about 350° C. to about 450° C. In addition, the semiconductanes are in a gaseous phase which can include one or more dopant gases. Illustrative dopant gases include those containing phosphorous such as phosphine, and those containing boron such as diborane. In addition, the gas phase may include an inert gas carrier such as argon or helium or hydrogen.

While various aspects of the invention have been set forth by the drawings and specification, it is to be understood that the foregoing detailed description is for illustration only and that various changes, as well as the substitution of equivalent constituents for those shown and described may be made without departing from the spirit and scope of the invention as set forth in the appended claims.

What is claimed is:

1. The method of producing amorphous semiconductor hydrides with specified bandgaps, which comprises controllling the temperature and partial pressure of higher order semiconductanes which are created pyrolytically on a substrate.

2. The method of claim 1 wherein said semiconductanes are selected from the class consisting of silanes, germanes, and mixtures thereof.

3. The method of claim 1 wherein the bandgap of each semiconductor hydride decreases as the temperature used in the formation of said hydride is increased.

4. The method of claim 1 wherein the bandgap of each semiconductor hydride is decreased as the amount of hydrogen therein is decreased.

5. The method of claim 1 wherein said temperature is varied about a prescribed midpoint temperature.

6. The method of claim 1 wherein higher order semiconductanes are mixed with monosemiconductanes.

7. The method of claim 1 wherein said temperature is controlled in the range below about 500° C.

8. The method of claim 1 wherein said temperature is modulated about a specified temperature.

9. The method of claim 1 wherein said higher order semiconductanes are disilanes.

10. The method of claim 9 wherein said disilanes are mixed with monosilanes.

* * * * *